US010672440B2

(12) United States Patent
Frederiksen

(10) Patent No.: US 10,672,440 B2
(45) Date of Patent: Jun. 2, 2020

(54) WRITE CYCLE EXECUTION BASED ON DATA COMPARISON

(71) Applicant: Micron Technology, Inc., Boise, ID (US)

(72) Inventor: Jeffrey Frederiksen, Santa Clara, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/572,278

(22) Filed: Sep. 16, 2019

(65) Prior Publication Data

US 2020/0058334 A1    Feb. 20, 2020

Related U.S. Application Data

(63) Continuation of application No. 16/103,237, filed on Aug. 14, 2018, now Pat. No. 10,446,203.

(51) Int. Cl.
| *G11C 7/22* | (2006.01) |
| *G11C 16/26* | (2006.01) |
| *G11C 16/10* | (2006.01) |
| *G11C 8/12* | (2006.01) |
| *G06F 12/0882* | (2016.01) |

(52) U.S. Cl.
CPC ............ *G11C 7/22* (2013.01); *G06F 12/0882* (2013.01); *G11C 8/12* (2013.01); *G11C 16/10* (2013.01); *G11C 16/26* (2013.01); *G06F 2212/1028* (2013.01)

(58) Field of Classification Search
CPC ........ G11C 11/1675; G11C 14/00; G11C 7/20
See application file for complete search history.

(56) References Cited

U.S. PATENT DOCUMENTS

| 5,701,516 A * | 12/1997 | Cheng ................. G06F 12/0804 710/22 |
| 6,587,894 B1 | 7/2003 | Stracovsky et al. |
| 7,664,922 B2 | 2/2010 | Ohtsuka et al. |
| 8,024,638 B2 | 9/2011 | Resnick et al. |
| 8,213,229 B2 | 7/2012 | Wilson et al. |
| 9,025,374 B2 | 5/2015 | Yang et al. |
| 2008/0212379 A1 | 9/2008 | Asauchi et al. |
| 2018/0260324 A1* | 9/2018 | Marathe .............. G06F 12/0804 |

* cited by examiner

*Primary Examiner* — Tuan T Nguyen
(74) *Attorney, Agent, or Firm* — Schwegman Lundberg & Woessner, P.A.

(57) ABSTRACT

Aspects of the present disclosure include a memory sub-system configured to reduce latency and power consumption during a read-write cycle. The memory system comprises a first memory component and a processing device operatively coupled to the first memory component. The processing device is configured to receive a request to write a first sequence of data bits from a first data block of a second memory component to memory media of the first memory component. In response to receiving the request, the processing device reads a second sequence of data bits from a second data block stored in the memory media of the first memory component, and compares the first sequence of data bits with the second sequence of data bits. The processing device determines whether to execute a write cycle, at the first memory component, to write the first sequence of data bits from the first data block to the memory media of the first memory component based on a result of comparing the first sequence of data bits with the second sequence of data bits.

20 Claims, 4 Drawing Sheets

WRITE CYCLE EXECUTION BASED ON DATA COMPARISON

PRIORITY APPLICATION

This application is continuation of U.S. application Ser. No. 16/103,237, filed Aug. 14, 2018, which is incorporated herein by reference in its entirety.

TECHNICAL FIELD

Embodiments of the disclosure relate generally to memory sub-systems, and more specifically, relate to write cycle execution in memory sub-systems based on data comparison.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory sub-systems of the memory system and to retrieve data stored from memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
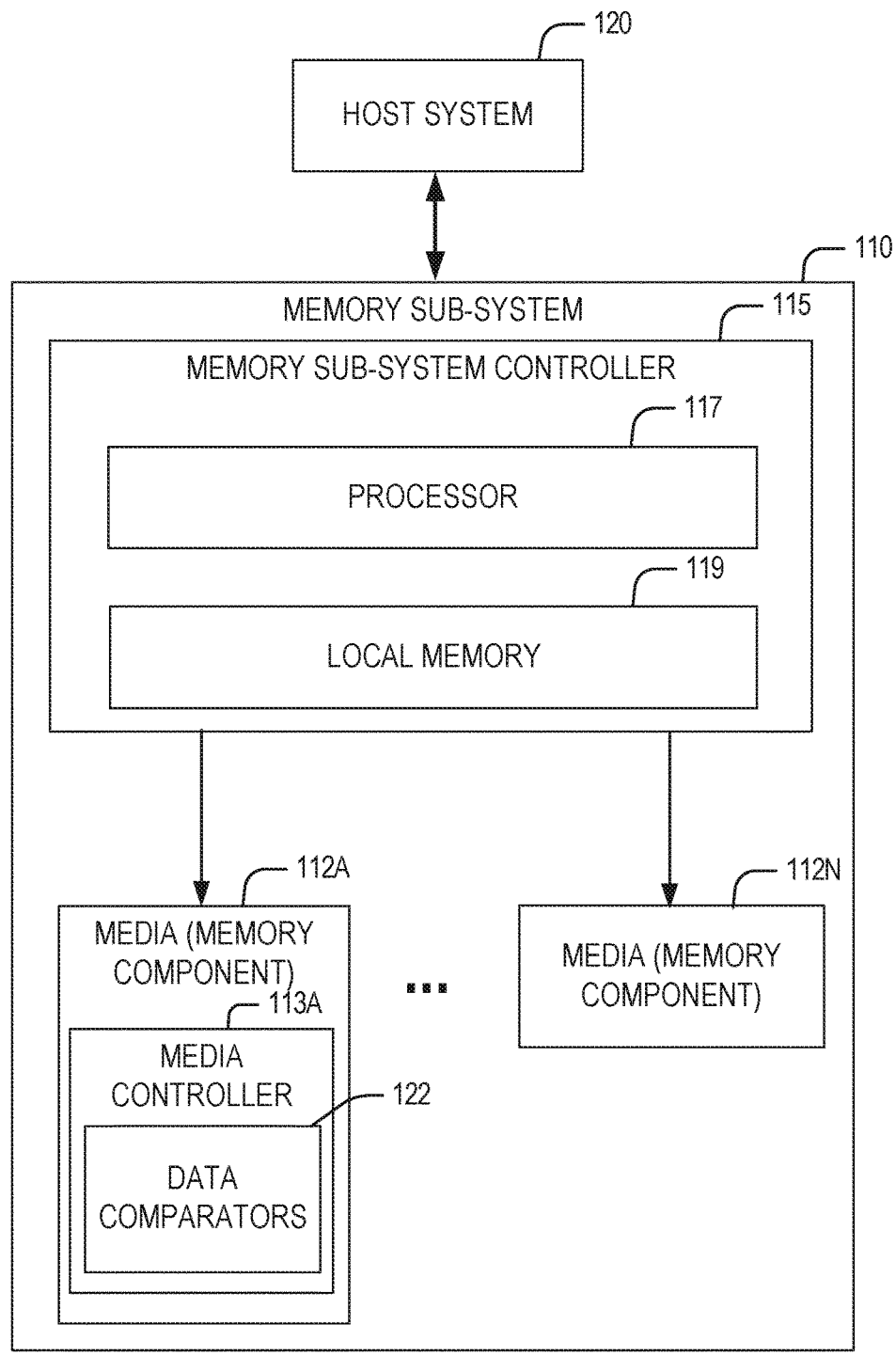
FIG. 1 is a block diagram illustrating an example computing environment including a memory system, in accordance with some embodiments of the present disclosure.

Aspects of the present disclosure are directed to reducing latency and power consumption during a read-write cycle in a memory sub-system by determining whether to execute a write cycle based on a data comparison. A memory sub-system is also hereinafter referred to as a "memory device". An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

A memory sub-system can include multiple memory components that can store data from the host system. The memory sub-system can further include a memory sub-system controller that can communicate with each of the memory component to perform operations such as reading data, writing data, or erasing data at the memory components in response to requests received from the host system. Any one or more of the memory components of the memory sub-system may include a media controller to manage memory cells of the memory component, communicate with the memory sub-system controller, and execute memory requests (e.g., read or write) received from the memory sub-system controller.

In some applications, the memory sub-system can include a primary memory component a cache or buffer) and a secondary memory component (e.g., a main memory). The secondary memory component stores copies of data stored at the primary memory component. In certain implementations such as virtual machines, the memory sub-system controller may not be aware of whether the data from the primary memory component has been modified since the last time the data was written to the secondary memory component, requiring the memory sub-system controller to unconditionally request data be written back to the secondary memory component. Conventionally, in response to receiving a write request from the host system, the media controller executes a read-write cycle at the secondary memory component, which results in an increased average latency and power consumption by the memory sub-system because the read-write cycle unconditionally executes regardless of whether the underlying data has been changed. The latency and power consumption issue is exacerbated by certain memory sub-systems that require large blocks of data (e.g., 4 KB-1 MB) to be handled in a single request, which can be wasteful considering that efficient block accessibility of such memory sub-systems can be on the order of 16 B. Even if the memory sub-system is capable of avoiding performance of a high-powered write by locally determining that the data has not changed, the write cycle itself is not avoided, and thus the write cycle time still adds to the latency and average power.

Aspects of the present disclosure address the above and other deficiencies by configuring a media controller of a memory component with a non-deterministic read-write cycle to skip execution of a write cycle if the data included in an incoming request has not been modified. For example, a media controller of a memory component can be configured to include one or more data comparators to compare incoming request data with corresponding data stored at the memory component to determine whether there has been any change to the data. If the media controller determines that the data has not changed based on a result of the comparison, the media controller skips execution of the write cycle. If, on the other hand, the media controller determines that at least one data bit has changed, the media controller executes the write cycle in response to the request and causes only the secondary memory blocks containing the changed data bits to be written to.

In this way, the conventional read-write cycle of memory sub-systems can be replaced with a read-compare cycle followed by an optional write cycle that is executed only if the data within a secondary memory block has been modified. Avoiding execution of the write cycle in instances in which no data has been modified can improve performance and efficiency of the memory sub-system. For example, in a memory component that has a fast low-powered read cycle (e.g., 100 ns) and a much slower high-powered write cycle (e.g., 400 ns), avoiding an unnecessary write cycle (e.g., when no data has been modified) can reduce the read-write cycle of 500 ns to a read-only cycle of 100 ns while also drastically reducing power consumption since the high-powered write cycle is avoided. Even if a memory component is capable of avoiding an actual high-powered write by locally determining that the data has not changed, the write cycle itself is not avoided, and thus the write cycle time still adds to the latency and average power per bit caused by clocking leakage and other effects.

Disclosed herein are some examples of memory sub-systems which are configured to reduce latency and power consumption during a non-deterministic read-write cycle.

FIG. 1 illustrates an example computing environment 100 including a memory sub-system 110, in accordance with some examples of the present disclosure. The memory sub-system 110 can include media, such as memory components 112A to 112N. The memory components 112A to 112N can be volatile memory devices, non-volatile memory devices, or a combination of such. In some embodiments, the memory sub-system 110 is a storage system. An example of a storage system is an SSD. In some embodiments, the memory sub-system 110 is a hybrid memory/storage system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), dynamic random access memory (DRAM), synchronous dynamic random access memory (SDRAM), phase change memory (PCM), magneto random access memory (MRAM), negative-or (NOR) flash memory, and a cross-point array of non-volatile memory cells. A cross-point array of non-volatile memory can perform hit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory sub-system controller 115 (hereinafter referred to as "controller") can communicate with the memory components 112A to 112N to perform operations such as reading data, writing data, or erasing data at the memory components 112A to 112N and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory components 112A to 112N. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The memory sub-system controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory components 112A to 112N.

Any one of the memory components 112A to 112N can include a media controller (e.g., media controller 113A) to manage the memory cells of the memory component, to communicate with the memory system memory sub-system controller 115, and to execute memory requests (e.g., read or write) received from the memory system memory sub-system controller 115.

In some implementations of the memory sub-system 110, at least one of the memory components 112A to 112N can be configured as a primary memory component (e.g., a cache or buffer), and at least one of the memory components 112A to 112N can be configured as a secondary memory component (e.g., main memory). For example, a non-volatile memory component such as a cross-point array type memory component can be used as a secondary memory component, and a volatile memory device such as a DRAM can be used as a primary memory component. In these implementations, data stored on the primary memory component is copied to the secondary memory component at various times. In some embodiments, the primary memory component can be a temporary storage component that temporarily stores data that is likely to be reused, and the secondary memory component can be a persistent storage component that stores persistent copies of the data stored in the temporary storage device.

Consistent with these embodiments, each of the memory components 112A to 112N may communicate with the memory system memory sub-system controller 115 via a separate channel. For example, the primary memory component may communicate with the memory system memory sub-system controller 115 via a dual in-line memory module (DIMM) interface, while the secondary memory component may communicate with the memory system memory sub-system controller 115 via a non-volatile DIMM (NVDIMM) interface or another such interface that allows for non-deterministic read-write cycles.

Consistent with these implementations, the memory sub-system controller 115 may not be aware of whether the data from the primary memory component has been modified since the last time the data was written to the secondary memory component. For example, in virtual machine implementations, the memory sub-system controller 115 can include a hypervisor that creates and runs virtual machines using the memory components 112A to 112N. In this example, the hypervisor does not have a priori knowledge of whether data stored in the primary memory component has been modified since it was last copied over to the secondary memory component. Accordingly, in these implementations, the memory sub-system controller 115 unconditionally sends a request to the media controller of the secondary memory component to write back data from the primary memory component to the secondary memory component regardless of whether it has been modified. Conventionally, in response to receiving a write request from the memory sub-system controller 115, the media controller of the secondary memory component (e.g., media controller 113A of memory component 112A) executes a read-write cycle at the secondary memory component the memory component 112A) whether or not the data needs to be written to the secondary memory component. This, in turn, results in an increased average latency for the memory sub-system 110, power consumption for the memory sub-system 110, or both. Additionally, the request from the media controller 115 (e.g., based on a request from a hypervisor operating on the host system 120) may be for a coarser resolution (e.g., coarser page size) than is optimal for the secondary memory component (e.g., the page size of the second memory component may be smaller than the page size of the request).

To address the forgoing latency and power consumption issue, a media controller of any one of the memory components 112A to 112N (e.g., the memory component configured as the secondary memory component) may be configured to include one or more data comparators to compare data from an incoming request from the memory sub-system controller 115 with corresponding data stored on the memory component to determine whether there has been any change to the data. For example, as shown, the media controller 113A of the memory component 112A includes data comparators 122 to determine whether data from incoming requests has been changed compared to the corresponding data stored at the media component 112A. The media controller 113A is further configured to determine whether to perform or forego the write cycle based on a result of the comparison. For example, if the media controller 113A determines that the data has not changed based on a result of the comparison, the media controller 113A skips execution of the write cycle, thereby reducing the latency and/or power consumption that would have otherwise been caused by needlessly executing the write cycle in an instance in which no data actually needed to be written to the memory component. On the other hand, if the media controller 113A determines that at least one data bit has changed, the media controller 113A executes the write cycle in response to the request and causes only the changed data bits to be written to the memory component. In this manner, the memory sub-system 110 is configured to have a read-compare cycle with an optional write cycle, rather than the conventional read-write cycle of memory components.

Figure 2:
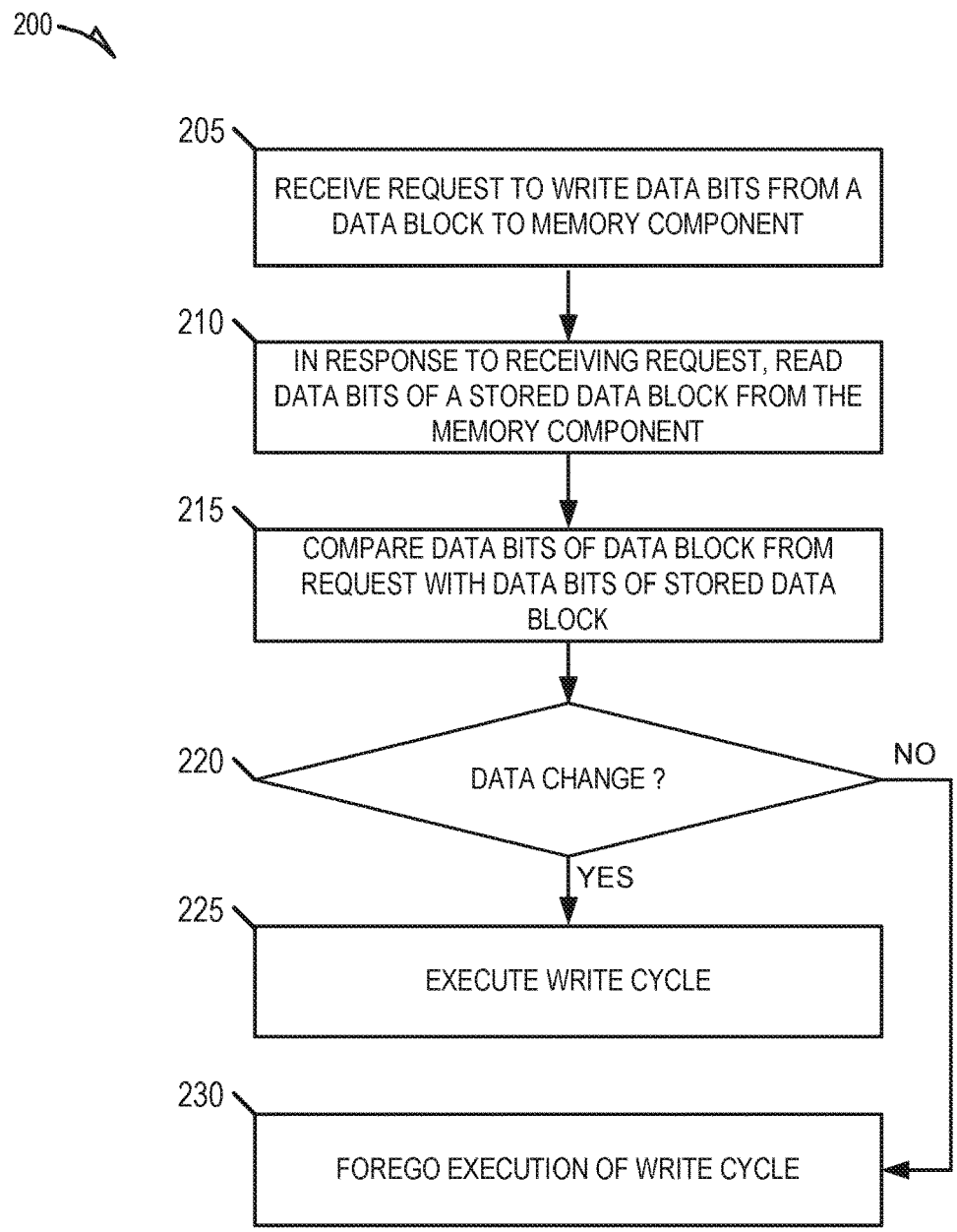
FIG. 2 is a flow diagram illustrating an example method to reduce latency and power consumption during a non-deterministic read-write cycle, in accordance with some embodiments of the present disclosure.

FIG. 2 is a flow diagram of an example method 200 to reduce latency and power consumption during a non-deterministic read-write cycle in accordance with some implementations of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the media controller 113A of FIG. 1. In these embodiments, the method 200 may be performed, at least in part, by the data comparator(s) 122. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block (or operation) 205, the processing device receives a request to write a first sequence of data bits from a data block of a first memory component to a second memory component. The first memory component can be a volatile memory component (e.g., double data rate (DDR) SDRAM) configured to be cache memory. The second memory component can, for example, be a non-volatile memory component with a non-deterministic read-write cycle (e.g., an array of cross-point memory cells).

As will be discussed further below, the write request can be generated by the memory sub-system controller 115 in response to encountering a cache miss in sending a memory request (e.g., write or read) to the first memory component. The request can include one or more memory addresses corresponding to one or more memory cells in the second memory component in which a second data block that is a version (e.g., a persistent version) of the first data block is stored.

At block 210, the processing device reads a second sequence of data bits from a stored data block from the second memory component in response to receiving the request. The stored data block is a copy of the data block from the incoming request. Thus, each bit in the second sequence of data bits corresponds to a bit from the first sequence of data bits.

At block 215, one or more comparators of the processing device compare data bits of the data block from the incoming request with data bits of the stored data block. In particular, the processing device compares the first sequence of data bits with the second sequence of data bits to identify any differences between the sequences of bits. In other words, the processing device compares each bit in the second sequence of data bits with a corresponding bit in the first sequence of data bits to determine whether a bit change has occurred.

At block 220, the processing device determines whether to execute a write cycle at the second memory component based on a result of the comparison. More specifically, the processing device determines whether to execute the write cycle at the second memory component based on whether there are any changes to the data determined by detected differences between the first sequence of data bits and the second sequence of data bits.

If, at block 220, the processing device detects a change to at least one data bit based on the comparison of the first and second sequences of data bits, the processing device executes a write cycle at the second memory component, at block 225. During the write cycle, the processing device can write only the changed hits to the corresponding memory cells in the second memory component, and the processing device may not write any unchanged bits. That is, the processing device can write only the data bits from the first sequence of data bits to the second memory component that correspond to the difference between the first sequence of data bits and the second sequence of data bits.

On the other hand, if, at block 220, the processing device does not detect a change to any bits in the associated secondary memory block, the processing device foregoes executing the write cycle, at block 230. That is, if the first and second sequences of data bits are identical, the processing device skips the execution of the write cycle at the second memory component altogether.

Figure 3:
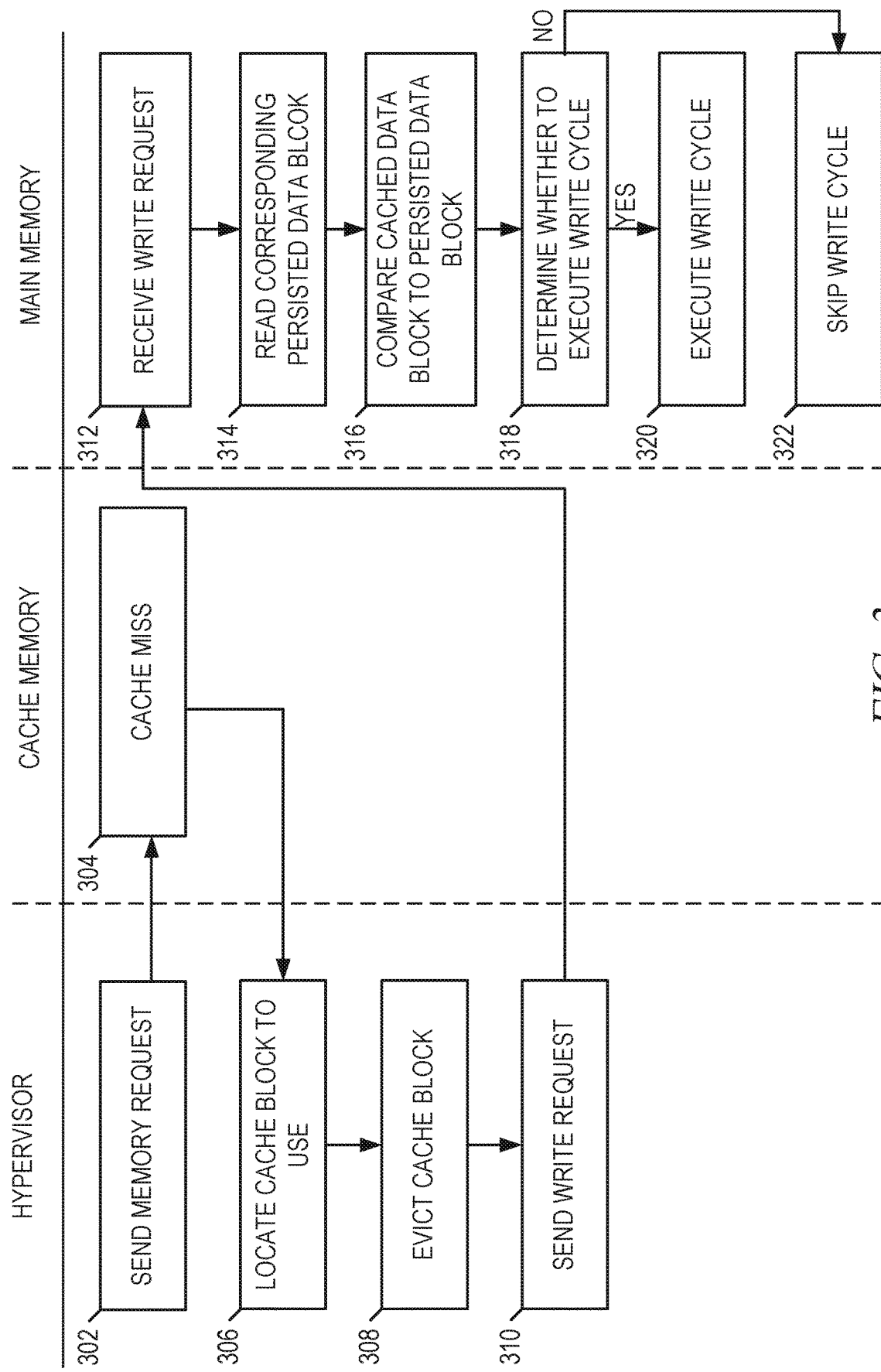
FIG. 3 is an interaction diagram illustrating interactions between components of the computing environment in the context of an example embodiment in which a method to reduce latency and power consumption during a non-deterministic read-write cycle can be implemented in accordance with some embodiments of the present disclosure.

FIG. 3 is an interaction diagram illustrating interactions between components of the computing environment 100 in the context of an example embodiment in which a method 300 to reduce latency and power consumption during a non-deterministic read-write cycle can be implemented. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by a combination of the memory sub-system controller 115 in the example form of a hypervisor, a first memory component (e.g., from the memory components 112A to 112N) in the example form of a cache memory component, and a second memory component (e.g., from the memory components 112A to 112N) in the example form of a main memory component. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

In the context of the example illustrated in FIG. 3, the cache memory component can be a volatile memory component (e.g., a DDR memory component). The main memory component can be a non-volatile memory component with a non-deterministic read-write cycle (e.g., a cross-point array of memory cells or HRAM memory device).

As shown, at block 302, the hypervisor sends a memory request directed to the cache memory component. The request can be either a request to read data from the cache memory component or a request to write data to the cache memory component. For some embodiments, the request from the hypervisor is at a data block size (e.g., page size, such as 4 kB) that is less than optimal for the main memory component optimal page size of 512 B). At block 304, a cache miss occurs at the cache memory component (e.g., because the cache memory component does not include an entry for the requested data).

In response to the cache miss, the hypervisor locates a cache block in the cache memory component, at block 306, and the hypervisor evicts the cache data block from the cache memory component, at block 308, to create space on the cache memory component for the requested data. Since the hypervisor does not have a priori knowledge of whether the evicted cache block has been modified since the last write-back to the main memory component, the hypervisor performs an unconditional write-back to the main memory component each time a cache data block is evicted from the cache whether or not the data block has been modified since the last write-back. Accordingly, at block 310, the hypervisor sends a write request to the memory sub-system controller 115 to write the cached data block to the memory media of the main memory component.

Upon receiving the write request at block 312, the memory sub-system controller 115 initiates a read-compare cycle at the main memory component along with an optional write cycle depending on the outcome of the read-compare cycle. More specifically, at block 314, the memory sub-system controller 115 reads a corresponding persisted data block stored at the main memory component. At block 316, one or more comparators (e.g., the data comparator(s) 122) of the memory sub-system controller 115 of the main memory component compare the data bits of the persisted data block to the data bits of the evicted cache data block included in the write request.

At block 318, the media controller of the main memory component determines whether to perform the write cycle based on a result of the comparison. In particular, if any one or more of the data bits of the evicted cache data block are different from corresponding data bits in the persisted data block, the media controller of the main memory component determines that the data block has been modified, and thus, the main memory component executes the write cycle, at block 320. In executing the write cycle, the media controller of the main memory component can cause only the data bits that have been changed to be written to the memory media of the main memory component.

If the data bits of the evicted cache data block are identical to the data bits of the persisted data block, the main memory component determines that the data block has not been modified, and thus no write cycle is necessary. Accordingly, the main memory component skips the write cycle, as shown at block 322, in response to determining that the data bits of the evicted cache data block are identical to the data bits of the persisted data block.

Figure 4:
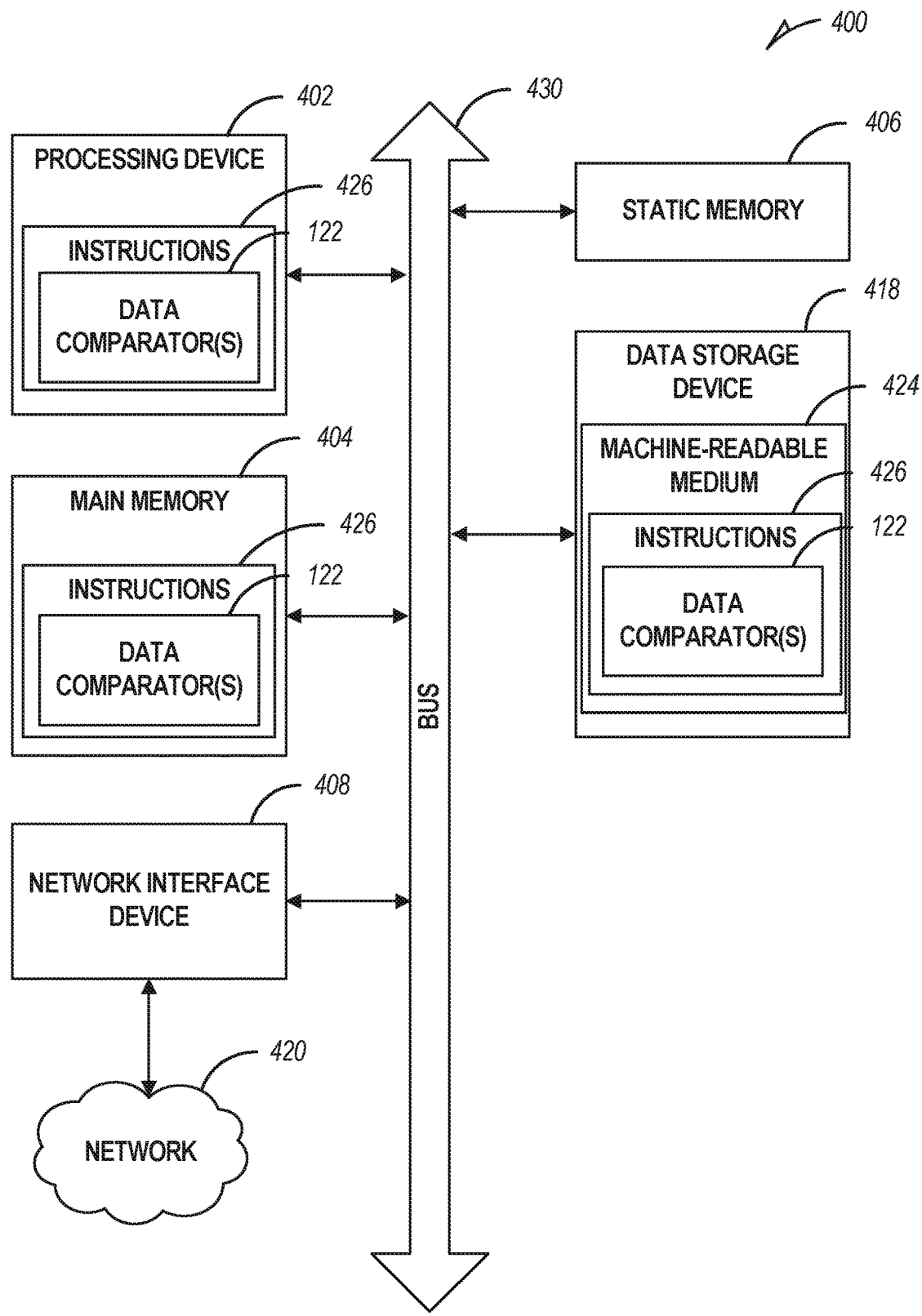
FIG. 4 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the data comparator(s) 122 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a data comparator (e.g., the data comparator(s) 122 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD- ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

EXAMPLES

Example 1 is a system comprising: a first memory component; and a processing device, operatively coupled to the first memory component, configured to perform operations comprising: receiving a request to write a first sequence of data bits from a first data block of a second memory component to memory media of the first memory component; in response to receiving the request, reading a second sequence of data bits from a second data block stored in the memory media of the first memory component; comparing the first sequence of data bits with the second sequence of data bits; and determining whether to execute a write cycle, at the first memory component, to write the first sequence of data bits from the first data block to the memory media of the first memory component based on a result of the comparing of the first sequence of data bits with the second sequence of data bits.

In Example 2, the subject matter of Example 1 optionally includes the operation of foregoing execution of the write cycle, at the first memory component, in response to determining that the first and second sequences of data bits are identical.

In Example 3, the subject matter of Example 1 optionally includes the operation of executing the write cycle in response to identifying at least one difference between the first and second sequences of data bits.

In Example 4, the write cycle of Example 3 optionally includes writing at least one data bit from the first sequence of data bits to the memory media of the first memory component.

In Example 5, the operation of writing the at least one data bit in Example 4 optionally includes writing over at least one stored data bit in the second data block, the at least one stored data bit corresponding to the at least one difference between the first and second sequences of data bits.

In Example 6, the subject matter of any one or more of Examples 1-5 can optionally include each data bit in the first sequence of data hits having a corresponding data bit in the second sequence of data bits; and the comparing of the first sequence of data bits with the second sequence of data bits can optionally include comparing each data bit in the first sequence of data bits with the corresponding data bit in the second sequence of data bits.

In Example 7, the subject matter of any one or more of Examples 1-6 can optionally include the first memory component being configured as a secondary memory component; and the second memory component being configured as a primary memory component.

In Example 8, the first memory component of any one or more of Examples 1-7 optionally includes non-volatile memory media; and the second memory component of any one or more of Examples 1-7 optionally includes volatile memory media.

Example 9 is a method comprising: receiving, at a media controller of a first memory component, a request to write a first sequence of data bits from a first data block of a second memory component to memory media of the first memory component; in response to receiving the request, reading a second sequence of data bits from a second data block stored in the memory media of the first memory component; comparing the first sequence of data bits with the second sequence of data bits; and determining whether to execute a write cycle, at the first memory component, to write the first sequence of data bits from the first data block to the memory media of the first memory component based on a result of the comparing of the first sequence of data bits with the second sequence of data bits.

In Example 10, the subject matter of Example 9 optionally includes the operation of foregoing execution of the write cycle, at the first memory component, in response to determining that the first and second sequences of data bits are identical.

In Example 11, the subject matter of Example 9 optionally includes the operation of executing the write cycle, at the first memory component, in response to identifying at least one difference between the first and second sequences of data bits.

In Example 12, the subject matter of Example 11 optionally includes the operation of writing at least one data bit from the first sequence of data bits to the memory media of the first memory component.

In Example 13, the subject matter of Example 12 optionally includes the operation of writing over at least one stored data bit in the second data block, the at least one stored data bit corresponding to the at least one difference between the first and second sequences of data bits.

In Example 14, the subject matter of any one or more of Examples 9-13 optionally includes each data bit in the first sequence of data hits having a corresponding data bit in the second sequence of data bits; and the comparing of the first sequence of data bits with the second sequence of data bits optionally includes comparing each data bit in the first sequence of data bits with the corresponding data bit in the second sequence of data bits.

In Example 15, the first memory component of any one or more of Examples 9-14 is optionally configured as a secondary memory component, and the second memory component is optionally configured as a primary memory component.

In Example 16, the first memory component of any one or more of Examples 9-15 optionally includes non-volatile memory media, and the second memory component optionally includes volatile memory media.

Example 17 is a memory sub-system comprising: a memory component; and a media controller, operatively coupled to the machine-readable memory media, the media controller configured to perform operations comprising: receiving a request to write a first sequence of data bits to the memory component; in response to receiving the request, reading a second sequence of data bits from the media component, the first sequence of data bits corresponding to the second sequence of data bits; comparing the first sequence of data bits with the second sequence of data bits; and determining whether to execute a write cycle, at the memory component, to write the first sequence of data bits to the memory component based on a result of the comparing of the first sequence of data bits with the second sequence of data bits.

In Example 18, the subject matter of Example 17 optionally includes the operation of foregoing execution of the write cycle, at the memory component, in response to determining that the first and second sequences of data bits are identical.

In Example 19, the subject matter of Example 17 optionally includes the operation of executing the write cycle in response to identifying at least one difference between the first and second sequences of data bits.

In Example 20, the subject matter of Example 19 optionally includes the operation of writing at least one data bit from the first sequence of data bits to the memory component of the memory sub-system.

The invention claimed is:

1. A system comprising:
  a first memory component; and
  a processing device, operatively coupled to the first memory component to determine whether to execute a write cycle, at the first memory component, to write a first sequence of data bits from a second memory component to the first memory component based on a comparison of the first sequence of data bits with a second sequence of data bits stored by the second memory component.

2. The system of claim 1, wherein the operations further comprise:
  foregoing execution of the write cycle, at the first memory component, in response to determining that the first and second sequences of data bits are identical.

3. The system of claim 1, wherein the operations further comprise:
  executing the write cycle in response to identifying at least one difference between the first and second sequences of data bits.

4. The system of claim 3, wherein the write cycle comprises:
  writing at least one data bit from the first sequence of data bits to the first memory component.

5. The system of claim 4, wherein the writing of the at least one data bit from the first sequence of data bits to the first memory component includes writing over at least one stored data bit in the second data block, the at least one stored data bit corresponding to the at least one difference between the first and second sequences of data bits.

6. The system of claim 1, wherein:
  each data bit in the first sequence of data bits has a corresponding data bit in the second sequence of data bits; and
  the comparing of the first sequence of data bits with the second sequence of data bits comprises comparing each data bit in the first sequence of data bits with the corresponding data bit in the second sequence of data bits.

7. The system of claim 1, wherein:
  the first memory component is configured as a secondary memory component; and
  the second memory component is configured as a primary memory component.

8. The system of claim 1, wherein:
  the first memory component includes a non-volatile memory component; and
  the second memory component includes a volatile memory component.

9. The system of claim 1, wherein the processing device is further to:
  receive a request to write the first sequence of data bits from a first data block of the second memory component to the first memory component;
  in response to receiving the request, reading the second sequence of data bits from a second data block stored in at the first memory component; and
  comparing the first sequence of data bits with the second sequence of data bits.

10. A system comprising:
  a non-volatile memory component comprising a persisted data block storing persisted data;
  a volatile memory component comprising a cached data block stored cached data; and
  a memory sub-system controller, operatively coupled to the non-volatile memory component, configured to perform operations comprising:
    receiving a request to write the cached data from the cached data block of the volatile memory component to the non-volatile memory component; and
    determining whether to execute a write cycle, at the non-volatile memory component, to write the cached data from the cached data block to the non-volatile memory component based on a comparison of the cached data with the persisted data.

11. The system of claim 10, wherein the operations further comprise:
  foregoing execution of the write cycle, at the non-volatile memory component, in response to determining that the cached data and the persisted data are identical.

12. The system of claim 10, wherein the operations further comprise:
  executing the write cycle in response to identifying at least one difference between the cached data and the persisted data.

13. The system of claim 12, wherein the write cycle comprises:
  writing at least a portion of the cached data to the non-volatile memory component.

14. The system of claim 13, wherein the writing of at least the portion of the cached data to the non-volatile memory component includes writing over at least one stored data bit in the persisted data block, the at least one stored data bit corresponding to the at least one difference between the between the cached data and the persisted data.

15. The system of claim 10, wherein:
   each data bit in the cached data has a corresponding data bit in the persisted data; and
   the comparing of the cached data and the persisted data comprises comparing each data bit in the cached data with the corresponding data bit in the persisted data.

16. A method comprising:
   receiving, at a media controller operatively coupled to a non-volatile memory component and a volatile memory component, a request to write cached data from a cached data block of the volatile memory component to the non-volatile memory component; and
   determining, by the media controller, whether to execute a write cycle, at the non-volatile memory component, to write the cached data from the cached data block to the non-volatile memory component based on a comparison of the cached data with a persisted data stored by the non-volatile memory component.

17. The method of claim 16, wherein the operations further comprise:
   foregoing execution of the write cycle, at the non-volatile memory component, in response to determining that the cached data and the persisted data are identical.

18. The method of claim 16, wherein the operations further comprise:
   executing the write cycle in response to identifying at least one difference between the cached data and the persisted data.

19. The method of claim 18, wherein the write cycle comprises:
   writing at least a portion of the cached data to the non-volatile memory component.

20. The method of claim 19, wherein the writing of at least the portion of the cached data to the non-volatile memory component includes writing over at least one stored data bit in the persisted data block, the at least one stored data bit corresponding to the at least one difference between the between the cached data and the persisted data.

* * * * *